(12) United States Patent
Jutteau et al.

(10) Patent No.: US 12,407,294 B2
(45) Date of Patent: Sep. 2, 2025

(54) METHOD AND DEVICE FOR OPTIMISING PHOTOVOLTAIC PANELS AND PHOTOVOLTAIC PANELS OPTIMISED USING THIS METHOD

(71) Applicants: ELECTRICITE DE FRANCE, Paris (FR); INSTITUT PHOTOVOLTAIQUE D'ILE DE FRANCE (IPVF), Palaiseau (FR); CENTRE NATIONAL DE LA RECHERCHE SCIENTIFIQUE—CNRS, Paris (FR); TOTALENERGIES ONETECH, Courbevoie (FR); ECOLE POLYTECHNIQUE, Palaiseau (FR)

(72) Inventors: Sébastien Jutteau, Igny (FR); Pierre-Philippe Grand, Saint-Maximin-la Sainte-Baume (FR); Cédric Guerard, Villebon sur Yvette (FR); Etienne Drahi, Paris (FR)

(73) Assignees: ELECTRICITE DE FRANCE, Palaiseau (FR); INSTITUT PHOTOVOLTAIQUE D'ILE DE FRANCE (IPVF), Palaiseau (FR); CENTRE NATIONAL DE LA RECHERCHE SCIENTIFIQUE—CNRS, Paris (FR); TOTALENERGIES SE, Courbevoie (FR); ECOLE POLYTECHNIQUE, Palaiseau (FR)

( * ) Notice: Subject to any disclaimer, the term of this patent is extended or adjusted under 35 U.S.C. 154(b) by 0 days.

(21) Appl. No.: 18/253,087

(22) PCT Filed: Nov. 19, 2021

(86) PCT No.: PCT/EP2021/082366
§ 371 (c)(1),
(2) Date: May 16, 2023

(87) PCT Pub. No.: WO2022/106652
PCT Pub. Date: May 27, 2022

(65) Prior Publication Data
US 2023/0421094 A1 Dec. 28, 2023

(30) Foreign Application Priority Data

Nov. 20, 2020 (FR) .................................. 2011935

(51) Int. Cl.
H02S 30/00 (2014.01)
H02S 40/36 (2014.01)
H02S 50/10 (2014.01)

(52) U.S. Cl.
CPC .............. *H02S 30/00* (2013.01); *H02S 40/36* (2014.12); *H02S 50/10* (2014.12)

(58) Field of Classification Search
CPC .......... H02S 30/00; H02S 40/36; H02S 50/10; Y02E 10/50; H01L 25/043; H01L 31/02008; H01L 31/043
See application file for complete search history.

(56) References Cited

U.S. PATENT DOCUMENTS

2011/0139228 A1* 6/2011 Arai .................... H01L 31/1884
252/514
2018/0083151 A1* 3/2018 Shibasaki ........... H01L 31/0465

FOREIGN PATENT DOCUMENTS

DE 102018216768 A1 4/2020
EP 3923468 A1 12/2021
WO 2020113251 A1 6/2020

OTHER PUBLICATIONS

Ze'ev R Abrams: "Alternative Strategies for Maximizing the Output of Multi-Junction Photovoltaic Panels", arXiv.org, 1412.2056, pp. 1-11, Dec. 5, 2014, XP055351662 (Year: 2014).*

(Continued)

*Primary Examiner* — Michael Y Sun
(74) *Attorney, Agent, or Firm* — Maier & Maier, PLLC (57) ABSTRACT

A method for optimizing an existing generator system based on photovoltaic cells and provided with an existing photovoltaic panel or a group of existing photovoltaic panels, each panel having a first plurality of cells of a first type interconnected in series or in series/in parallel. The method includes: determining an operating voltage of the panel(s); producing additional panel module(s) having a second plurality of thin-film cells of a second type and having a different band gap width than the cells of the panel(s), the (Continued)

additional module(s) being configured to supply an operating voltage equal, within ±10%, to the voltage of the panel(s); positioning the additional module to overlap on or under the panel or one of the panel(s), the module being connected in parallel to the panel(s), or positioning several additional modules to overlap on or under several panels, the several modules being connected in parallel to panels.

13 Claims, 7 Drawing Sheets

(56) References Cited

OTHER PUBLICATIONS

International Search Report and Written Opinion issued on Feb. 2, 2022, in corresponding International Application No. PCT/EP2021/082366, 19 pages.
Abrams., "Alternative Strategies for Maximizing the Output of Multi-Junction Photovoltaic Panels", arXiv preprint arXiv:1412.2056, 2014, pp. 1-11.
Hook., "Alternative to silicon offers cheaper solar power", Financial Times, Jan. 8, 2018, pp. 1-4.

* cited by examiner

METHOD AND DEVICE FOR OPTIMISING PHOTOVOLTAIC PANELS AND PHOTOVOLTAIC PANELS OPTIMISED USING THIS METHOD

FIELD

The invention lies within the field of electric generators based on solar panels and relates to a method for optimizing a photovoltaic panel as well as to a photovoltaic panel optimized according to this method.

BACKGROUND

It is known to produce photovoltaic panels comprising several layers of stacked photovoltaic cells in order to convert different wavelength ranges of sunlight and increase the efficiency of the panels. In particular, there are existing panels with tandem cells individually connected in parallel and multi-junction encapsulated photovoltaic modules comprising cells of a first type connected in series and forming a first sub-module, and cells of a second type forming a second sub-module, said first and second sub-modules being stacked to balance the no-load and load voltages of said groups of cells.

TECHNICAL PROBLEM

Panels with stacked modules therefore exist, but improving the performance of existing installations involves replacing aging or under-performing panels with such panels, which is complex and expensive.

There is therefore a need to reduce the cost of modernizing photovoltaic panel farms and to avoid scrapping existing panels while making it possible to update an aging photovoltaic power plant. Similarly, during the installation or service life of a solar power plant based on photovoltaic panels, it may be desirable to be able to increase the amount of energy produced if demand increases, without increasing the surface area covered by the panels of the solar power plant.

SUMMARY

For this purpose, the present application relates to one or more additional photovoltaic modules (hereinafter additional modules) that can be installed and connected directly to one or more existing conventional panels, new or already installed, in order to increase the amount of energy produced by means of the assembly composed of the existing panel(s) or a group of existing panels and the additional module(s).

To achieve this, the invention proposes a method for optimizing an existing generator system based on photovoltaic cells and provided with an existing photovoltaic panel or a group of existing photovoltaic panels, each existing panel being provided with a first plurality P of cells of a first type interconnected in series or in series/in parallel, by means of one or more additional modules, which comprises:
  determining an operating voltage $V_{MPP}$ of said existing panel or group of panels once assembled with said one or more additional modules,
  producing one or more additional modules comprising a second plurality Q of photovoltaic cells of a second type and having a different band gap width than the cells of the existing panel or of the existing panels of the group of existing panels, said second plurality Q of cells of the additional module(s) being configured to supply an operating voltage V1 equal, to within ±10%, to the voltage $V_{MPP}$ of said existing panel or of said group of existing panels,
  positioning the additional module in an overlapping manner on or under the existing panel, said module being connected in parallel to said existing panel, or positioning said several additional modules in an overlapping manner on or under several of said existing panels of said group of existing panels, said several modules being connected in parallel to at least some of the existing panels or said group of existing panels.

This makes it possible in particular to improve an existing photovoltaic power plant, whether rooftop or a solar farm, by taking advantage of installations already present without modifying their structure, or to update an aging photovoltaic power plant, for example due to the yellowing of Ethyl Vinyl Acetate (EVA) or other encapsulation material, without replacing the existing panels.

In addition, due to its different band gap width, the additional module has a spectral response complementary to the existing panel; performance of the assembly is improved.

The additional module(s) may comprise a plurality of sub-modules S1, S'1 of cells supplying said operating voltage V1 and themselves connected in parallel.

This increases the power supplied by the additional panel, which nevertheless remains within the footprint of the existing panel.

The arrangement of the plurality Q of cells of the additional module(s) is preferably carried out according to a different electrical and spatial configuration than the plurality P of cells of the existing panel or of the panels of the group of existing panels.

This makes the panel less sensitive to shading effects: the spatial and electrical organization of the module, different from that of the existing panel, compensates for losses from the latter in cases of partial shading.

The existing panel having a width l and a length L and said plurality Q of photovoltaic cells of the second type being arranged parallel to the length L of the existing panel, said method may comprise one or more steps of:
  determining the maximum power point voltage $V_{MPP}$ of the existing panel or of the group of existing panels when they are combined with an additional module;
  calculating the number N1 of photovoltaic cells of the second type to be placed in series to create a sub-module S1 of the additional module that is suitable for supplying said voltage V1;
  calculating a height $H_{cell}$ of said cells of the sub-module S1 and calculating the number M1 of sub-modules S1 that can be fitted in parallel over the width l of the existing panel so as to maximize the power of said module overlapping the existing panel at voltage V1;
  producing the additional module with photovoltaic cells of the second type comprising M1 sub-modules S1 in parallel, encapsulating the additional module, and installing the additional module so that it overlaps the existing panel.

The power of the modules and the coverage of the existing panels are thus optimized according to the voltage $V_{MPP}$ of the existing panel(s), with cells of modules having a width close to the width of the existing panels.

Alternatively, the existing panel having a width l and a length L and said plurality Q of photovoltaic cells of the second type being arranged parallel to the width l of the existing panel, said method comprises one or more steps of:

determining the maximum power point voltage $V_{MPP}$ of the existing panel or of the group of existing panels when they are combined with the additional module;

calculating the number N'1 of photovoltaic cells of the second type to be placed in series to create a sub-module S'1 of the additional module that is suitable for supplying said voltage V1;

calculating a height $H'_{cell}$ of said cells of the sub-module S'1 and calculating the number M'1 of sub-modules S'1 that can be fitted in parallel over the length L of the existing panel so as to maximize the power of the module overlapping the existing panel at voltage V1;

producing the additional module with photovoltaic of the second type comprising M'1 sub-modules S'1 in parallel, encapsulating the additional module, and installing (3) the additional module so that it overlaps the existing panel.

The power of the module and the coverage of the existing panel are thus optimized according to the voltage $V_{MPP}$ of the existing panel, with cells of the module having a width close to the length of the existing panel.

According to a first embodiment, said band gap width of the cells of the second type being greater than the band gap width of the cells of the first type, said at least one additional module can be installed overlapping a face of the existing panel that is exposed to the sun or overlapping a face of the existing panel that is opposite to the face exposed to the sun.

According to a second embodiment, said band gap width of the cells of the second type being less than the band gap width of the cells of the first type, said at least one additional module can be installed overlapping a face of the existing panel that is opposite to a face exposed to the sun.

According to one particular embodiment, an optical interface material that is transparent to wavelengths active for the existing panel and whose refractive index is adapted to minimize reflections at the interface between the additional module and the existing panel is placed between the additional module and the existing panel.

This improves the performance of the existing overlapped panel.

The invention further relates to a panel optimized by means of the method according to any one of the preceding claims.

This optimized panel can comprise an existing panel and an additional module provided with a plurality of sub-modules S1 or S'1 of cells, connected in parallel by connection traces created on said module.

The additional module of the optimized panel can be fixed to the existing panel by means of a transparent encapsulant material or adhesive or any non-adhesive mechanical fastening means such as screws, bolts, rivets, or clips.

According to one particular embodiment, the existing panel is a full-cell, half-cell, or shingle-cell type of panel.

Lastly, the invention proposes an additional module suitable for the implementation of an optimized panel according to the method of the invention.

The cells of the sub-modules provided with connection traces of the additional module advantageously extend over a width of the module or over a length of the module or in two groups each extending over half of said width or length.

The cells of the additional module can be cells of thin-film technology.

The cells of the additional module can be cells produced by a structure-controllable photovoltaic technology, such as CIGS, Perovskite, CdTe, or amorphous silicon technologies with a different band gap than that of the cells of the existing panel.

The cells of the additional module can more generally be cells produced by a type III-V photovoltaic technology.

BRIEF DESCRIPTION OF THE DRAWINGS

Other features, details, and advantages of the invention will become apparent upon reading the detailed description below of some non-limiting exemplary embodiments, and upon analyzing the appended drawings, in which.

DETAILED DESCRIPTION

The drawings and the description below contain elements which may not only serve to provide a better understanding of the invention, but where appropriate may also contribute to its definition.

Photovoltaic panels have certain limitations such as sensitivity to shading and are subject to aging. For example, photovoltaic panels encapsulated for example with Ethyl Vinyl Acetate (EVA) can yellow/brown over time after exposure to UV, as described in Oliveira, M. C. C. D., Diniz, A. S. A. C., Viana, M. M., Lins, V. F. C.

"*The causes and effects of degradation of encapsulant ethylene vinyl acetate copolymer (EVA) in crystalline silicon photovoltaic modules: A review*" in Renewable and Sustainable Energy Reviews Volume 81, Part 2, January 2018, Pages 2299-2317. This effect reduces the exposure of the panel's cells to light and therefore decreases its performance. This effect is included in the calculation of the degradation rate of panels' generation potential, today around 0.5-0.7%/year. This degradation leads to having to replace the panels, which is a costly operation.

As for sensitivity to shading, a conventional panel, depending on its technology and its configuration, can no longer deliver some of the maximum power that could be supplied, if part of its surface is no longer exposed to light. In the case of panels whose cells are connected in series with bypass diodes connected in parallel with groupings of cells, for example models with three bypass diodes defining three groups of cells which represent the majority of commercial products currently available, ⅓ of the maximum power is lost when one cell of a group is shaded, ⅔ of the maximum power is lost for shading on cells of two groups, and all the power is lost in the event of partial shading distributed among the three groups. This therefore leads to a loss of efficiency for the installations.

Shading management is a performance optimization issue, particularly for rooftop installations in private homes or in commercial applications as described in the document Quaschning, V. and Hanitsch, R.—1996—"*Numerical simulation of current-voltage characteristics of photovoltaic systems with shaded solar cells*" Solar Energy Volume 56, Issue 6, June 1996, Pages 513-520.

The object of the invention is therefore to propose a solution which allows solving the problems of aging and/or shading in a simple manner and which allows increasing the efficiency and generation potential of existing panels without changing them out.

The main idea concerns a device consisting of an additional photovoltaic panel module which is installed and connected directly to an existing conventional panel, new or already installed, in order to increase the amount of energy produced by the assembly of conventional panel—additional module.

This allows, for example, improving an existing photovoltaic power plant, rooftop or farm, by taking advantage of installations already present, or updating an aging photovoltaic power plant. The additional module can in particular be based on the flexibility of manufacturing a panel in thin-film technology produced in particular by structure control such as laser patterning or other structure control to modify its electrical characteristics (in current and in voltage) in order to adapt to the various types of existing panels on which the additional module can be installed.

To allow parallel connection of the additional module and the existing panel, the additional module is designed to form a photovoltaic panel having an operating voltage equal to the operating voltage of the existing panel +/−10% once the two systems are associated, meaning that an operating voltage $V_{MPP}$ of said existing panel or group of panels is determined once assembled with said one or more additional modules, knowing the type of additional module that one wishes to use and in particular the transparency of this module at the frequencies necessary for the existing panel.

The performance of a single-junction panel, with silicon-type cells, is theoretically limited to around 29% efficiency. However, due to manufacturing process issues, the practical limit should reach 25%. A commercial panel today has an efficiency between 18 and 22%.

Tandem cells based on silicon have a theoretical efficiency of around 43%. Tandem panels with around 30% efficiency are expected in the next few years.

The method and the module of the invention use a different technology than the existing panel in order to improve the performance of the assembly. One possibility is the use of cells with thin-film technology and/or structure-controllable technology, for example by using a laser, such as cell technologies based on CIGS, Perovskite, CdTe, or hydrogenated amorphous silicon which are currently known. It can of course use any newly emergent photovoltaic cells technology having at least partial transparency to the useful wavelengths for the existing panel.

The technology of structured cells allows creating a custom electrical architecture by alternating the phases of electrical isolation, such as laser etching, and electrical connection, such as the deposition of conductive film, and by making serial or parallel connections. The module produced is semi-transparent, i.e. it allows light to pass through in the wavelengths not absorbed by its cells, which can in particular allow recovering light energy at the cells of the existing panel when the additional panel module covers the existing panel on its side exposed to the sun. With this in mind, in the event that the module is positioned overlapping the face of the existing panel that is exposed to the sun, i.e. on the panel, the module will be based on photovoltaic technology with a gap energy greater than the technology of the existing panel. For example, the module can then use Perovskite cells, with a band gap energy Eg e which can be defined between 1.2 and 1.9 eV, CdTe cells with a band gap energy Eg on the order of 1.5 eV, or hydrogenated amorphous silicon cells with a band gap energy Eg of 1.7 eV to 1.9 eV. The band gap energy of the additional module is chosen to be different from that of the additional panel, and the above technologies apply in particular in the case where the existing panel uses thick mono or polycrystalline silicon cells, with a band gap energy Eg on the order of 1.1 eV.

More generally, the cells of the additional module are cells produced by type III-V photovoltaic technology with a different band gap than that of the cells of the existing panel.

If the module is placed on a face of the existing panel that is opposite to the face exposed to the sun, i.e. under the panel to receive the light reflected by the ground or by the support of the existing panel, the cells of the module can have a higher or lower band gap energy than that of the cells of the existing panel.

The module comprises a conventional substrate of glass or plastic, which can be rigid or flexible, on which is deposited all the layers enabling the creation of photovoltaic cells, these layers being structured to create the cells and their connection traces. For protection purposes, this assembly can be covered with an encapsulant material of the polymer type, for example Polyolefin, or of the inorganic type, for example $Al_2O_3$, and a second rigid or flexible layer of glass or plastic can be laminated on the module. Finally, a rigid or flexible frame can be installed around the module to stiffen it or insulate it at its edges.

Figure 8:
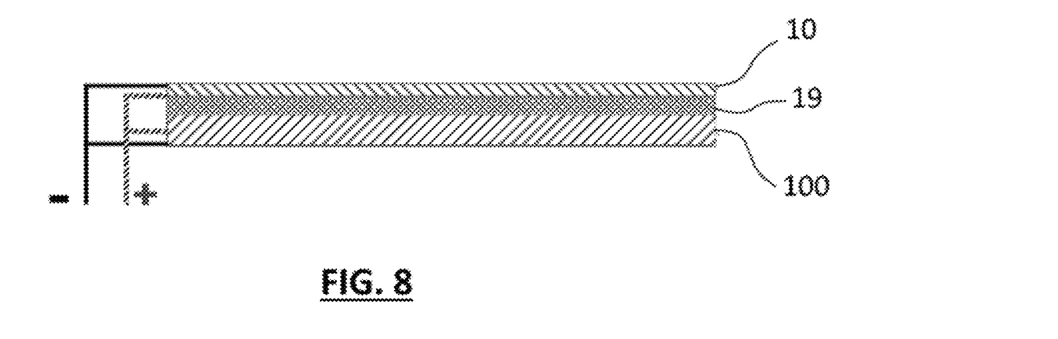
FIG. 8 shows a schematic side view of an example of an optimized panel.

As shown in FIG. 8, the additional module 10 is advantageously fixed to the existing panel, for example a panel 100, by means of a transparent encapsulant material or adhesive 19. A material transparent to the operating wavelengths of the panel minus the spectral range absorbed by the additional module, which is for example between 700 and 1200 nm at a minimum, whose refractive index will minimize reflections at the interfaces between the module and the existing panel, can be used to make the optical connection between the existing panel and the additional module in order to allow irradiation of the existing panel.

According to a first embodiment of the invention, the additional module is configured to present a voltage V1 at its output terminals that is close to the voltage $V_{MPP}$ of the existing panel during operation when the latter is combined with the additional module. The voltage V1 is chosen as being at least the voltage $V_{MPP}$ ±10% which constitutes an acceptable error.

The existing panel is a panel of known type, in particular with monocrystalline or polycrystalline silicon cells. According to FIG. 1, the existing panel 100 can for example be of the traditional full-cell type with rows 101, 102, 103, 104, 105, 106 of cells 150 in series, the rows themselves being connected in series by connections 110, 120. The panel further comprises bypass diodes 131, 132, 133 which will inhibit the shaded parts of the panel. According to FIG. 2, the panel 200 is of the half-cell 250 type with two banks of secondary arrays of half-cells 200a, 200b connected in series by connections 220a, 220b, 210 and in parallel by connections 115. In this case the panel also comprises three bypass diodes 231, 232, 233. According to FIG. 3, the panel 300 is of the shingle-cell type 350 and comprises a first half-panel 301 comprising strips 301a, . . . , 301f of cells in series, these strips being connected in parallel, and a second half-panel comprising strips of cells in series 302a, . . . , 302f which themselves are connected in parallel. The strips of the sub-panels 301, 302 are connected in series by connections 310 and in parallel by connections 315, 325. In this last case, two bypass diodes 331, 332 are provided. The existing panel can be single-sided to transform light reaching one side, or double-sided, i.e. adapted to transform light reaching both sides.

Figure 1:
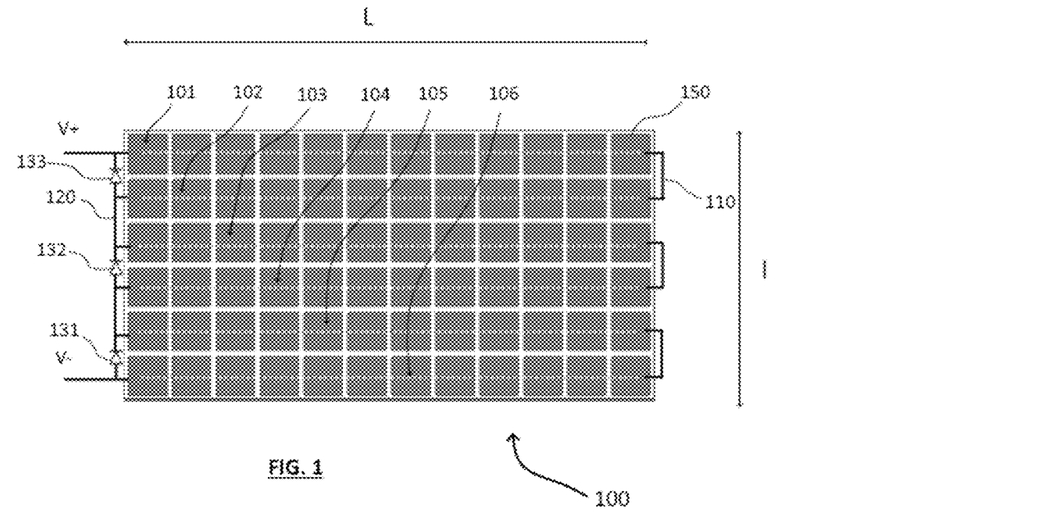
FIG. 1 shows a schematic top view of a first type of existing panel.

Taking the case of the full-cell panel, the voltage $V_{MPP}$ of the panel is the sum of the voltages $V_{MPPC}$ of the unit cells, 72 cells in the example, and the current is the current passing through each of the cells in the absence of shading. For the half-cell panel, the voltage is the sum of the voltages of half the cells of the panel, i.e. the voltage of 2×36 cells according to the example, and the current is the sum of the currents of the half-panels. In the case of the panel with shingle cells, the output voltage of the panel is the sum of the voltages of the successive cell elements in a strip along the length of the panel, 72 elements in the example, and the current is the sum of the currents of the strips running parallel across the width of the panel. We can thus define the existing panel as comprising a major array $R_{E1}$ supplying the output current and voltage of the panel, and possibly minor arrays $R_{E2}$ placed in parallel in the existing panel where applicable.

The additional module according to the examples shown will be constructed from a minor array of cells formed as a strip of length $L_{cell}$ and height $H_{cell}$ which are placed in series in order to reach the voltage V1 equal to $V_{MPP}$ of the existing panel, to within 10%.

Figure 6:
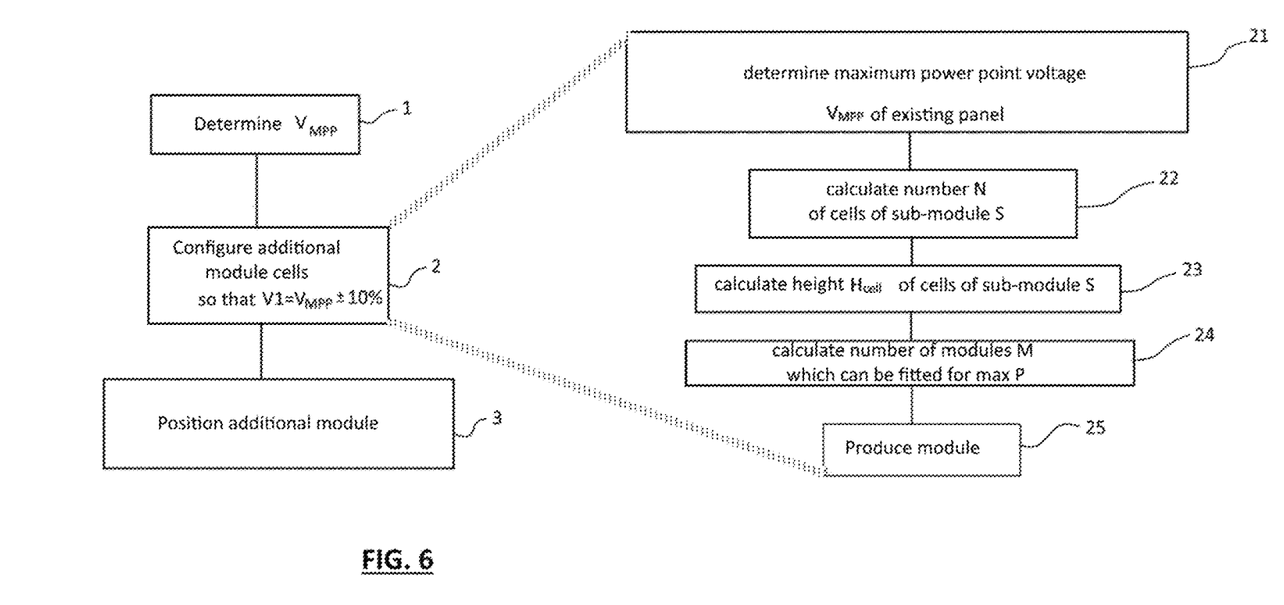
FIG. 6 shows a simplified flowchart of the method.

FIG. 6 illustrates the optimization method which includes determining in step 1 an operating voltage $V_{MPP}$ of an existing panel having P cells of a first type, for example cells based on crystalline silicon, producing in step 2 an additional module 10 comprising a second plurality Q of cells of the second type and having a different band gap width than the cells of the existing panel, configured to supply an operating voltage V1 equal, to within ±10%, to voltage $V_{MPP}$ of said panel or of said group of existing panels, positioning in step 3 the additional module in an overlapping manner on or under the existing panel, the module being connected in parallel to said existing panel or to said group of existing panels. For the production of the structured cells of the module, the starting point is the width l and the length L of the panel and we choose whether the plurality Q of cells is arranged parallel to the length L of the existing panel or to its width.

In step 21, the maximum power point voltage $V_{MPP}$ of the existing panel combined with the additional module is then determined;

In step 22, the number N of cells to be connected in series is calculated in order to produce a sub-module S1 of the additional module that is suitable for supplying said voltage V1.

In step 23 a height $H_{cell}$ of said cells of the sub-module S1 is calculated, and in step 24 the number M1 of sub-modules S1 that can be fitted in parallel over the width l of the existing panel is calculated, maximizing the power of said module overlapping the existing panel, at voltage V1. It should be noted that steps 23 and 24 are interdependent. Several combinations can exist but the one that allows delivering the maximum amount of power is chosen.

In step 25, the additional module is produced using structure-controllable photovoltaic technology comprising M1 sub-modules S1 in parallel, the additional module is encapsulated, and the additional module is installed so as to overlap the existing panel.

For example in the case of the full-cell PERC panel (for Passivated Emitter and Rear Contact) in FIG. 1, considering that the cells are silicon cells of $V_{MPPC}$ once associated with the complementary module the voltage $V_{MPP}$ of the existing panel is 39.7V. For an additional module with Perovskite cells, the voltage $V_{cellMPP}$ is 0.864V. It will therefore take N1=46 Perovskite cells in series to supply voltage V1.

Figure 4:
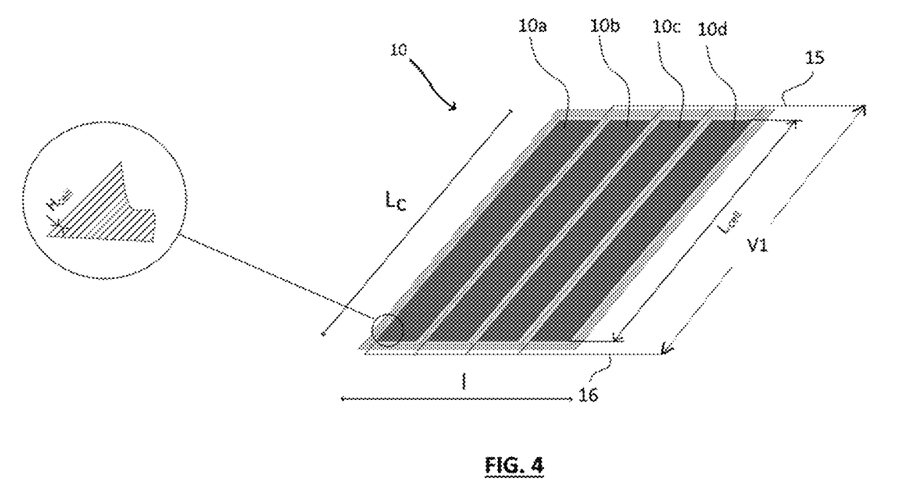
FIG. 4 shows a schematic perspective view of a module applicable to the invention.

From this value, the number of cells of an equivalent optimized panel of Perovskite used alone is calculated. Starting with the dimensions of length 1950 mm and width 950 mm of the existing panel and the optimal height of 5.03 mm of a Perovskite cell, a possible number of 180 cells across the width of the panel is obtained while considering the necessary connections and routings. To fill the panel surface and keep the voltage $V_{MPP}$ of the existing panel, the height of the cells is then slightly reduced to obtain a multiple of 46 cells across the width of the panel, which gives 184 cells and therefore M1=4 minor arrays S1 placed in parallel to supply voltage V1. The resulting additional module is schematically represented in FIG. 4 with the minor arrays 10a, 10b, 10c, 10d each comprising 46 cells of length $L_{cell}$ and of cell height $H_{cell}$ of 4.91 mm to supply a voltage V1 equal to $V_{MPP}$, to within these minor arrays being connected in parallel by connections 15 and 16 to create the module having a width adapted to the existing panel. In this configuration, the losses at the complementary module are 0.1 W which is very low compared to a panel with cells of optimal dimensions as above.

The spatial organization of the existing panel according to FIG. 1 is an organization where the cells are serially connected in rows and have zigzag connections row by row along the height of the panel, whereas the spatial organization of the complementary module comprises, extending along the height of the panel, four strips of cells connected in parallel, the strips of cells being composed of cells connected in series along a direction parallel to the height of the panel. The two panels thus have different spatial and electrical organizations. Thus, with the method of the invention, the additional module will be configured on demand according to the type of existing panel to be renovated.

For example, for a 955 mm wide half-cell panel with cells having a $V_{MPPC}$ of and therefore a $V_{MPP}$ of 40.5V, the additional module of the same configuration will have N1=47 cells of height $H_{cell}$=4.32 mm connected in series per sub-array S1, the error of V1 relative to $V_{MPP}$ here being 0.4%. It is then possible to arrange four sub-arrays S1 in parallel, i.e. 188 cells within the width of the panel, taking into account the connection traces and the presence of a free peripheral area for gripping the module or for the possible addition of a frame. The losses compared to the ideal dimensions are again 0.1 W.

The 47 cells in series in a strip 4.32 mm high and of a length equivalent to the length of the panel form a sub-array or minor array S1, four minor arrays being connected in parallel to form a major array.

In this case, the existing panel comprises 6 minor arrays of cells in series, each minor array comprising two superimposed half-rows of cells in series, the minor arrays being connected in parallel two by two over the length of the panel then connected in series along the width of the panel to form the major array of the existing panel, while the complementary module still has four strips of cells connected in parallel along the height of the panel, the cell strips being composed of cells connected in series along a direction parallel to the panel height. Here again, the spatial organization and electrical organization of the two panels is different.

For a panel with shingle cells 955 mm wide, starting from an optimal distribution of 182 cells 5 mm high arranged along the width of the panel, we arrive at an arrangement, still taking into account the connection traces and the presence of a free peripheral area for gripping the module or for the possible addition of a frame, with 168 cells 5.44 mm high, i.e. 4 minor arrays S1 each having 42 cells for an error in V1 of 0.2% compared to $V_{MPP}$. The power loss here is only 0.3 W.

It should be noted that in any case, because the module is structured on demand according to the configuration of the existing panel, it is possible to organize the complementary module with strips of cells extending over the width of the panel, connected in series along the length of the panel, these strips being placed in parallel one after the other along the length of the panel. This allows for example orienting the cells of the additional module.

Figure 5A:
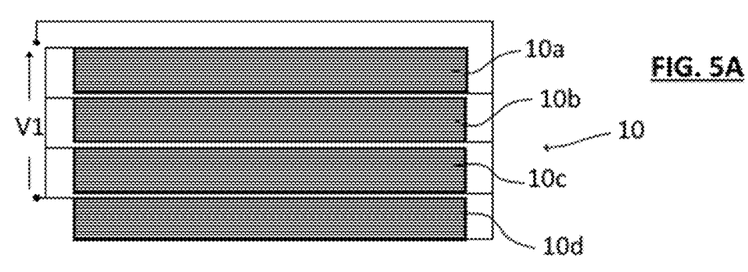
FIG. 5A shows the module of FIG. 4 in a top view.

To illustrate the improvement in the performance of the assembly in the event of shading, we consider the case of FIGS. 5A to 5D in a configuration with a Perovskite additional module 10 of 300 W of power, represented in FIG. 5A with four sub-arrays 10a, 10b, 10c, 10d connected in parallel. This additional module is placed on the existing panel on the illuminated face of the existing panel and is connected in parallel to this panel. In this example, the existing panel used is a full-cell PERC silicon panel rated at 300 W. Such a panel, which has a configuration as described in FIG. 1, is provided with six rows 101, 102, 103, 104, 105, 106 of cells connected in series and three bypass diodes 131, 132, 133. It delivers about 160 W when under the additional module.

Figure 5B:
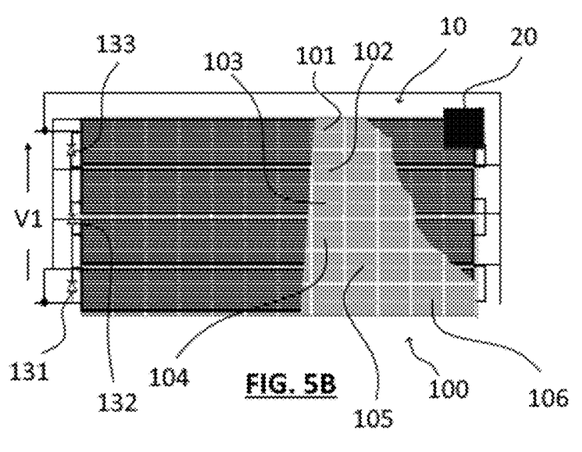
FIG. 5B shows the module of FIG. 4 associated with an existing panel under a first type of shading.

In the case of FIG. 5B, where the cells of the existing panel are shown through a cutout in the module, the shading 20 is located in the upper right corner and covers a cell of row 101 as well as a portion of the cells of the first strip of cells of the module.

Panel 100 then sees all of its cells in rows 101 and 102 deactivated, and diode 133 becomes conductive which causes a loss of ⅓ of its power. On the other hand, because of its configuration, the additional module loses little power and overall the balance is favorable.

Figure 5C:
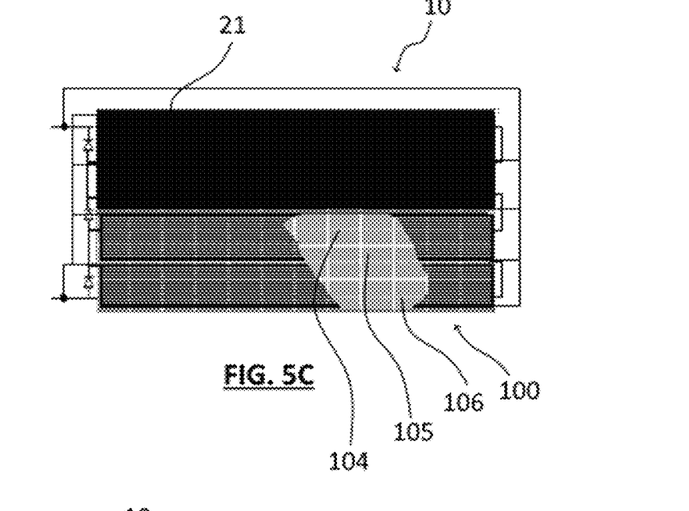
FIG. 5C shows the module of FIG. 4 associated with an existing panel under a second type of shading.
Figure 5D:
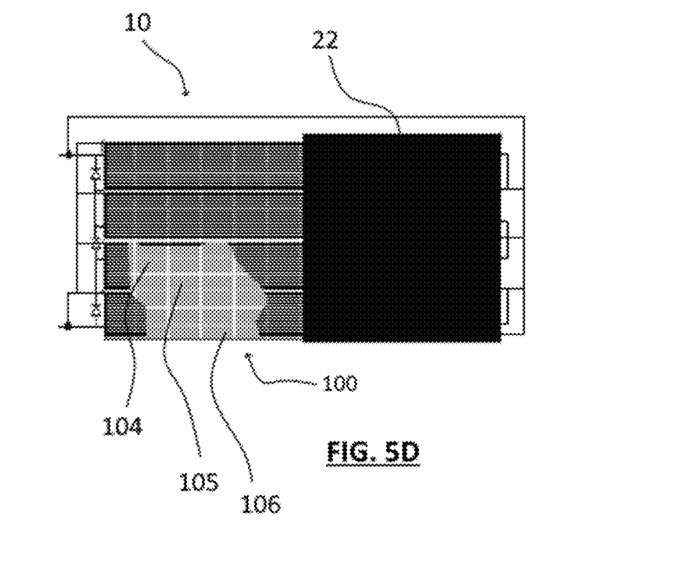
FIG. 5D shows the module of FIG. 4 associated with an existing panel under a third type of shading.

The same applies to the cases of FIG. 5C with shading 21 of the upper half of the assembly, and FIG. 5D with shading 22 of a lateral half.

Measurements carried out on prototypes in the laboratory are represented in the table below for standardized illuminations corresponding to 1000 W/m² with a spectrum close to the AM1.5G definition. The presence of the additional module has reduced the overall losses.

TABLE 1

|  | EXISTING PANEL ALONE (W); loss | ADDITIONAL MODULE (W) | TOTAL EXISTING PANEL + ADDITIONAL MODULE (W); loss |
|---|---|---|---|
| WITHOUT SHADING | (362) | 298.6 | 455 |
| SHADING 20 | (224); 38% | 292 | 389; 15% |
| SHADING 21 | (94); 74% | 136 | 177; 61% |
| SHADING 22 | (0); 100% | 136 | 136; 70% |

Figure 2:
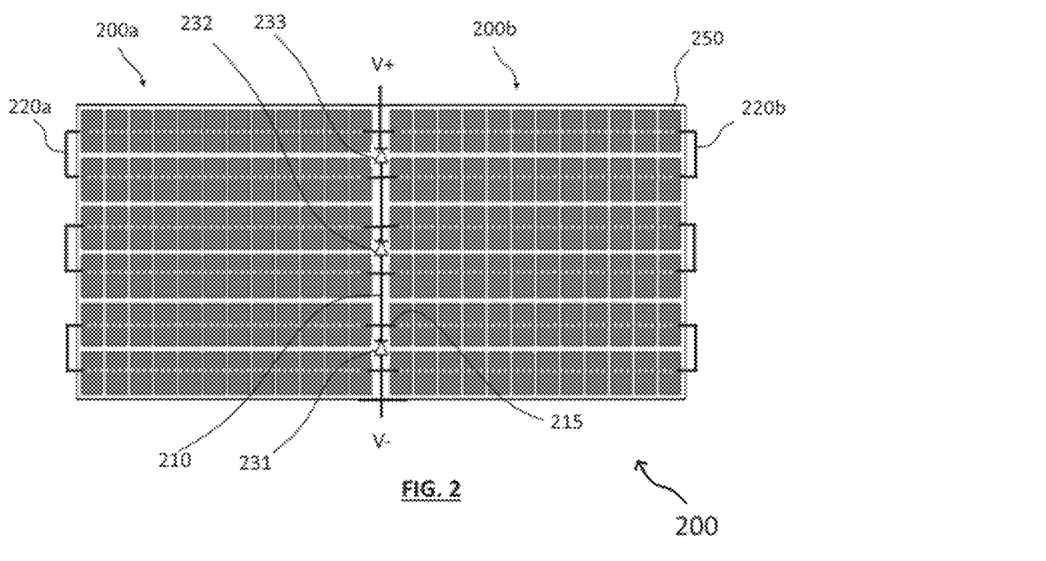
FIG. 2 shows a schematic top view of a second type of existing panel.
Figure 3:
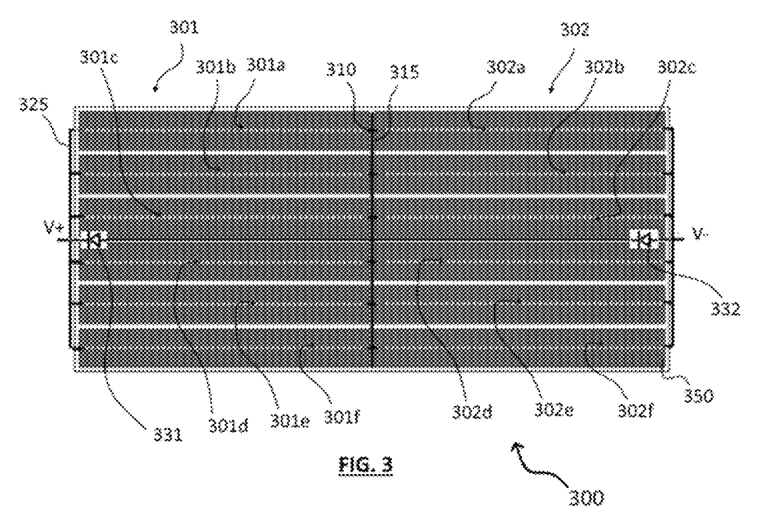
FIG. 3 shows a schematic top view of a third type of existing panel.

In the case of an existing half-cell panel, as shown in FIG. 2, with similar dimensions and nominal power associated with a similar additional module, the values measured in the laboratory are given in the table below:

TABLE 2

|  | EXISTING PANEL ALONE (W); loss | MODULE (W) | TOTAL(W); loss |
|---|---|---|---|
| WITHOUT SHADING | (359) | (302) | (458) |
| SHADING 20 | (219), 39% | (295) | (391); 15% |
| SHADING 21 | (90); 75% | (139) | (178); 61% |
| SHADING 22 | (172); 52% | (139) | (214); 53% |

In all cases, there is an increase in the power produced as well as a drop in sensitivity to shading once the additional panel is installed.

Figure 9A:
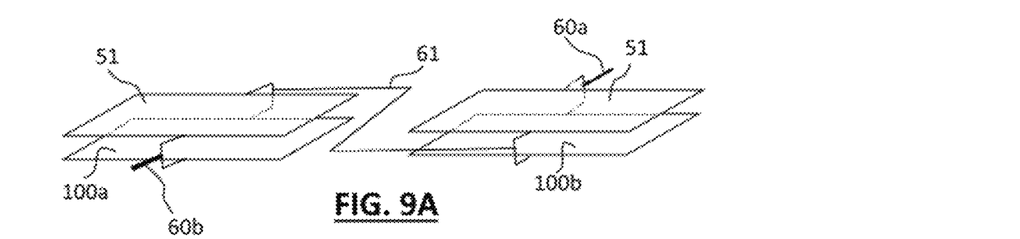
FIG. 9A shows a schematic view of a first example of an optimized panel.
Figure 9B:
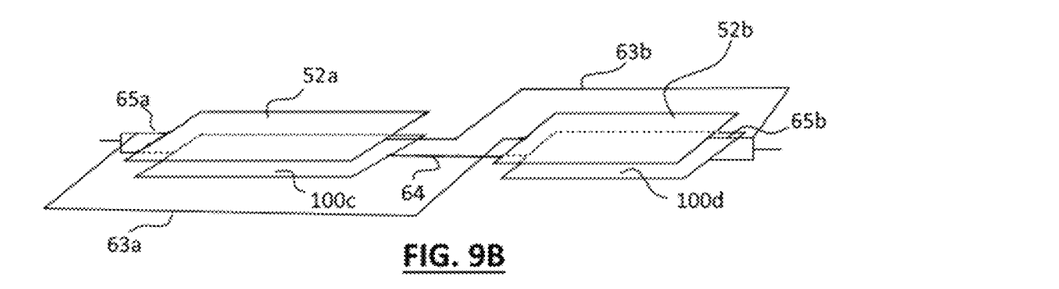
FIG. 9B shows a schematic view of a second example of an optimized panel.
Figure 9C:
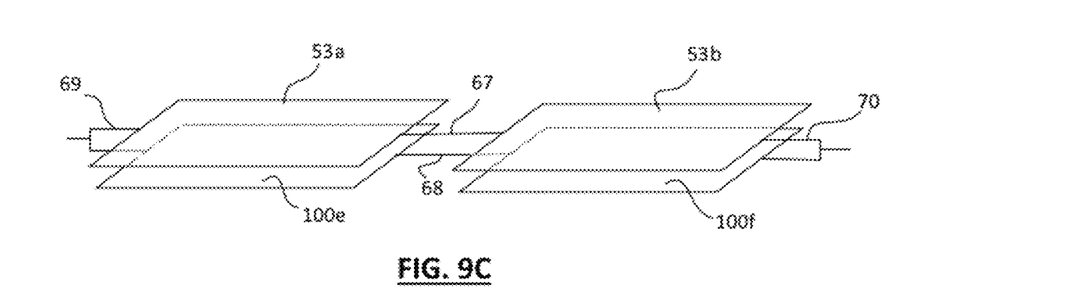
FIG. 9C shows a schematic view of a third example of an optimized panel.

FIGS. 9A to 9C give examples of possible configurations within the scope of the invention.

In FIG. 9A, each existing panel 100a, 100b is connected in parallel to a complementary module 51 and these individually optimized panels are connected in series by a connection 61 and are connected to other panels by the serial connection 60a, 60b.

In FIG. 9B, additional panels 52a, 52b are positioned on panels 100c, 100d of a group of panels 100c, 100d, and connected in parallel to these panels 100c, 100d by connections 63a, 63b, 65a, 65b, panels 100c, 100d being connected in series by a connection 64. In this case, the voltage V1 of the modules must be the voltage $2 \times V_{MPP}$ which is a sum of the $V_{MPP}$ of each panel of the group.

In FIG. 9C, each panel 100e, 100f of a group of two panels receives an additional module 53a, 53b. The existing panels are connected in series by a connection 68, the modules 53a, 53b are connected in series by a connection 67, and the pair of existing panels 100e, 100f are connected in parallel to the pair of complementary panel modules 53a, 53b. In this case, the voltages V1 of each module 53a, 53b must be established so that the voltage of all the additional panels connected in series corresponds to the voltage of all the existing panels placed in series. This can be generalized to a complete string of existing panels managed by a voltage converter.

Beyond the examples shown, the number of panels of the groups of panels can be different than two while remaining within the scope of the invention.

It is thus possible, within the framework of the invention, to add the additional modules to the existing panels of a group of panels and to connect these modules to each other in series, and in parallel with all the panels which themselves are connected in series as shown in FIG. 9C for two existing panels and two additional modules. This can be useful if, for example, it is desired to offset localized shading phenomena on a photovoltaic farm or to reduce the costs of updating the farm.

Figure 7:
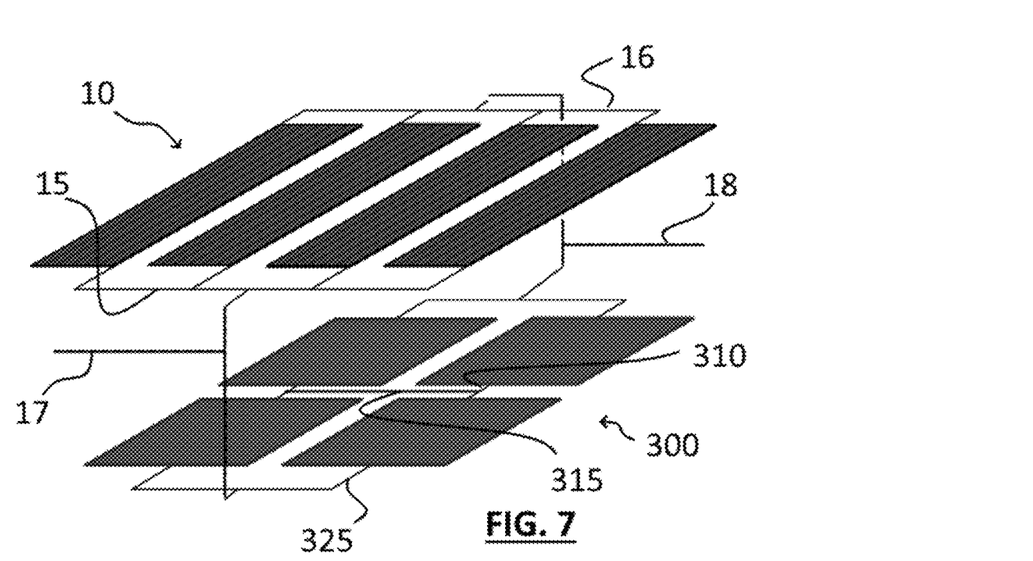
FIG. 7 shows an example of module positioning on an existing panel.

In the example of FIG. 7, the additional module 10 is placed so as to overlap the existing shingle-cell panel 300 and is connected in parallel with the latter to create a common voltage output 17, 18.

In such a case, the voltage V1 of the additional module will be calculated by taking for the value of $V_{MPP}$ the sum of the voltages $V_{MPP}$ of the panels connected in series and the module will be structured accordingly.

In the case where the additional module uses structured thin-film technology, this technology can be implemented all at once by depositing and structuring the component layers of the strips forming the cells and the traces directly on a single substrate, for example by laser patterning.

The invention is not limited to the examples described above, but encompasses all variants conceivable to a person skilled in the art in the context of the protection sought. In particular, as long as the additional module allows the passage of wavelengths active for the existing panel and its spatial and electrical layout is different from this existing panel while its voltage $V_{MPP}$ is close to that of the existing panel, the cell technology of the additional module can be other than thin-film technology. Furthermore, in the case of cells in strips, the orientation of the strips constituting the cells of the additional module can be parallel to the length or the width of the existing panel(s) and the surface covered by this module can be adapted to optimize the number of parallel minor arrays. Finally, the band gap of the cells of the additional module can be chosen to allow a range of wavelengths to pass through these cells that is adapted to maximize productivity of the cells of the existing panel under the additional module.

The invention claimed is:

1. A method for optimizing an existing generator system based on photovoltaic cells and provided with an existing photovoltaic panel or a group of existing photovoltaic panels, each existing panel being provided with a first plurality P of cells of a first type which are interconnected in series or in series/in parallel, comprising:
   determining an operating maximum power point voltage VMPP of said existing panel or group of panels,
   producing one or more additional modules comprising a second plurality Q of photovoltaic cells of a second type and having a different band gap width than the cells of the existing panel or of the existing panels of the group of existing panels, said second plurality Q of cells of the additional module(s) being configured to supply an operating voltage V1 equal, to within ±10%, to said maximum power point voltage VMPP of said existing panel or of said group of existing panels once assembled with said one or more additional modules,
   positioning said one or more additional modules in an overlapping manner on or under the existing panel, said one or more additional modules being connected in parallel to said existing panel, or positioning said one or more additional modules in an overlapping manner on or under several of said existing panels of said group of existing panels, said one or more additional modules being connected in parallel to at least some of the existing panels or said group of existing panels.

2. The method for optimizing an existing generator system based on photovoltaic cells according to claim 1, wherein said one or more additional modules comprise a plurality of sub-modules S1, S'1 of cells supplying said operating voltage V1 and said sub-modules being connected in parallel.

3. The method for optimizing an existing generator system based on photovoltaic cells according to claim 1, wherein the arrangement of the plurality Q of cells of said one or more additional modules is carried out according to a different electrical and spatial configuration than the plurality P of cells of the existing panel or of the panels of the group of existing panels.

4. The method for optimizing an existing generator system based on photovoltaic cells according to claim 1, wherein the existing panel having a width 1 and a length L and wherein said plurality Q of photovoltaic cells of the second type being arranged parallel to the length L of the existing panel, said method comprises one or more of the following steps:
   determining the maximum power point voltage VMPP of the existing panel or of the group of existing panels;
   calculating the number N1 of photovoltaic cells of the second type to be placed in series to create a sub-module S1 of the additional module that is suitable for supplying said voltage V1;
   calculating a height Hcell of said cells of the sub-module S1 and calculating the number M1 of sub-modules S1 that can be fitted in parallel over the width 1 of the existing panel so as to maximize the power of said module overlapping the existing panel at voltage V1; and
   producing the additional module with photovoltaic cells of the second type comprising M1 sub-modules S1 in parallel, encapsulating the additional module, and installing the additional module so that it overlaps the existing panel.

5. The method for optimizing an existing generator system based on photovoltaic cells according to claim 1, wherein the existing panel having a width 1 and a length L and wherein said plurality Q of photovoltaic cells of the second type being arranged parallel to the width 1 of the existing panel, said method comprises one or more of the following steps:
   determining the maximum power point voltage VMPP of the existing panel or of the group of existing panels;
   calculating the number N'1 of photovoltaic cells of the second type to be placed in series to create a sub-module S'1 of the additional module that is suitable for supplying said voltage V1;
   calculating a height H'cell of said cells of the sub-module S'1 and calculating the number M'1 of sub-modules S'1 that can be fitted in parallel over the length L of the existing panel so as to maximize the power of the module overlapping the existing panel at voltage V1; and
   producing the additional module with photovoltaic cells of the second type comprising M'1 sub-modules S'1 in parallel, encapsulating the additional module, and installing the additional module so that it overlaps the existing panel.

6. The method for optimizing an existing generator system based on photovoltaic cells according to claim 1, wherein, said band gap width of the cells of the second type being less than the band gap width of the cells of the first type, said at least one additional module is installed overlapping a face of the existing panel that is opposite to a face exposed to the sun of such existing panel.

7. The method for optimizing an existing generator system based on photovoltaic cells according to claim 1, wherein an optical interface material that is transparent to wavelengths active for the existing panel and whose refractive index is adapted to minimize reflections at the interface between the additional module and the existing panel is placed between the additional module and the existing panel.

8. A method for optimizing an existing generator system based on photovoltaic cells and provided with an existing photovoltaic panel or a group of existing photovoltaic panels, each existing photovoltaic panel being provided with a first plurality P of cells of a first type that are interconnected in series or in series/in parallel, comprising:
   determining an operating maximum power point voltage VMPP of said existing panel or group of panels,
   producing one or more additional modules comprising a second plurality Q of photovoltaic cells of a second type and having a different band gap width than the first plurality P of cells of the existing photovoltaic panel or of the existing photovoltaic panels of the group of existing photovoltaic panels, said second plurality Q of cells of the one or more additional modules being configured to supply an operating voltage V1 equal, to within ±10%, to said maximum operating power point voltage VMPP of said existing photovoltaic panel or of said group of existing photovoltaic panels once assembled with said one or more additional modules, positioning said one or more additional modules in an overlapping manner on or under the existing photovoltaic panel, said one or more additional modules being connected in parallel to said existing photovoltaic panel, or positioning said one or more additional modules in an overlapping manner on or under several of said existing photovoltaic panels of said group of existing photovoltaic panels, said one or more additional modules being connected in parallel to at least some of the existing photovoltaic panels or said group of existing photovoltaic panels, and wherein said band gap width of the second plurality Q of photovoltaic cells of the second type being greater than the band gap width of the first plurality P of cells of the first type, said one or more additional modules are installed overlapping a face of the existing photovoltaic panel that is exposed to the sun or overlapping a face of the existing photovoltaic panel that is opposite to the face exposed to the sun.

9. The method for optimizing an existing generator system based on photovoltaic cells according to claim 8, wherein said one or more additional modules comprise a plurality of sub-modules S1, S'1 of cells supplying said operating voltage V1 and said sub-modules being connected in parallel.

10. The method for optimizing an existing generator system based on photovoltaic cells according to claim 8, wherein the arrangement of the second plurality Q of cells of said one or more additional modules is carried out according to a different electrical and spatial configuration than the first plurality P of cells of the existing panel or of the panels of the group of existing panels.

11. The method for optimizing an existing generator system based on photovoltaic cells according to claim 8, wherein the existing photovoltaic panel having a width 1 and a length L and wherein said plurality Q of photovoltaic cells of the second type being arranged parallel to the length L of the existing panel, said method comprises one or more of the following steps:

determining the maximum power point voltage VMPP of the existing panel or of the group of existing panels;

calculating a number N1 of photovoltaic cells of the second type to be placed in series to create a sub-module S1 of an additional module that is suitable for supplying said voltage V1;

calculating a height Hcell of said photovoltaic cells of the sub-module S1 and calculating a number M1 of sub-modules S1 that can be fitted in parallel over the width 1 of the existing panel so as to maximize the power of one of said additional module overlapping the existing panel at voltage V1; and producing said additional module with photovoltaic cells of the second type comprising M1 sub-modules S1 in parallel, encapsulating said module, and installing said additional module to overlap the existing panel.

12. The method for optimizing an existing generator system based on photovoltaic cells according to claim 8, wherein the existing panel having a width 1 and a length L and wherein said plurality Q of photovoltaic cells of the second type being arranged parallel to the width 1 of the existing panel, said method comprises one or more of the following steps:

determining the maximum power point voltage VMPP of the existing panel or of the group of existing panels;

calculating the number N'1 of photovoltaic cells of the second type to be placed in series to create a sub-module S'1 of an additional module that is suitable for supplying said voltage V1;

calculating a height H'cell of said photovoltaic cells of the sub-module S'1 and calculating the number M'1 of sub-modules S'1 that can be fitted in parallel over the length L of the existing panel so as to maximize the power of said additional module overlapping the existing panel at voltage V1; and producing said additional module with photovoltaic cells of the second type comprising M'1 sub-modules S'1 in parallel, encapsulating said additional module, and installing said additional module to overlap the existing panel.

13. The method for optimizing an existing generator system based on photovoltaic cells according to claim 8, wherein an optical interface material that is transparent to wavelengths active for the existing panel and whose refractive index is adapted to minimize reflections at the interface between the one or more additional modules and the existing panel is placed between the one or more additional modules and the existing panel.

\* \* \* \* \*